(12) United States Patent
Boussina et al.

(10) Patent No.: US 6,269,464 B1
(45) Date of Patent: Jul. 31, 2001

(54) ERROR CHECKING TECHNIQUE FOR USE IN MASS STORAGE SYSTEMS

(75) Inventors: Touraj Boussina, San Carlos; Jerry Miller, Santa Clara, both of CA (US)

(73) Assignee: Sutmyn Storage Corporation, Santa Clara, CA (US)

( * ) Notice: Subject to any disclaimer, the term of this patent is extended or adjusted under 35 U.S.C. 154(b) by 0 days.

(21) Appl. No.: 09/098,449

(22) Filed: Jun. 17, 1998

Related U.S. Application Data
(60) Provisional application No. 60/049,908, filed on Jun. 18, 1997.

(51) Int. Cl.[7] ................................................. H03M 13/00
(52) U.S. Cl. ........................ 714/752; 714/758; 714/799; 714/807
(58) Field of Search ................................. 714/752, 758, 714/807, 799

(56) References Cited

U.S. PATENT DOCUMENTS

| | | | |
|---|---|---|---|
| 5,638,384 | * | 6/1997 | Hayashi et al. ................. 714/758 |
| 5,954,835 | * | 9/1999 | Higginson et al. ............. 714/807 |
| 6,003,151 | * | 12/1999 | Chuang ........................... 714/752 |

* cited by examiner

*Primary Examiner*—Phung M. Chung
(74) *Attorney, Agent, or Firm*—Townsend and Townsend and Crew LLP

(57) ABSTRACT

A system of error checking a sequence of concatenated packets of data for errors utilizes a CRC checker and a predictor which generates a prediction based on an all ones sequence of bytes the same length as the sequence. The sequence includes segments ending with bang CRCs (!CRCs) and padding bytes of all ones.

5 Claims, 4 Drawing Sheets

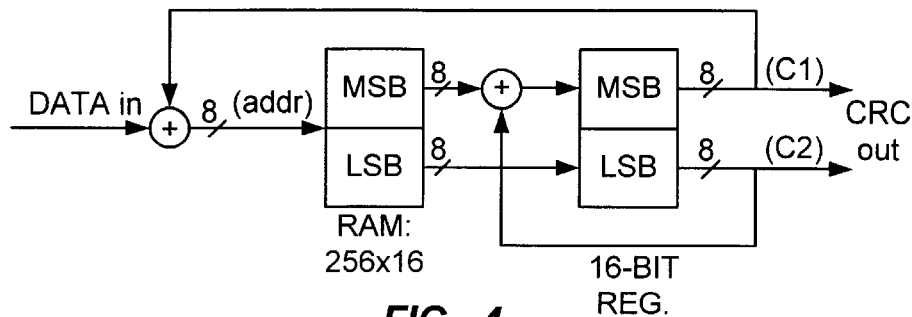

FIG. 4.

```
static unsigned short ones_crc    ;    // see 8.5 for creation of this array
static unsigned short crc_log     ;    // "   "
static unsigned short crc_log     ;    // "   "

unsigned short predict(prediction, length)
unsigned short prediction;
unsigned length;                       // aggregate length since last prediction
{
        length=length%65535;   // reduce length mod $2^{16} -1$
        if (prediction)        // do steps 1, 2 steps 1, 2
        prediction=prediction crc_antilog[(crc_log[prediction]+length)%65535];

step 3
        prediction=prediction ones_crc[length];

return (prediction);
{
```

FIG. 5.

ERROR CHECKING TECHNIQUE FOR USE IN MASS STORAGE SYSTEMS

CROSS-REFERENCES TO RELATED APPLICATIONS

This application claims the benefit of Provisional Application Serial No. 60/049,908, filed Jun. 18, 1997, which is incorporated herein by reference for all purposes.

BACKGROUND OF THE INVENTION

The present invention relates generally to error detection and, more particularly, to error detection in a system where data is "packetized" and passes through several interfaces prior to storage on non-volatile media.

Cyclic Redundancy Checking (CRC) is a well-known error detection technique that calculates CRC byte(s) for data and appends the CRC bytes to the data to be propagated together as a CRC packet. A CRC checker then checks the CRC packet to determine whether the data has been corrupted during propagation.

Subsequently, the CRC packet itself is grouped with other CRC packets to form "super packets". It is then necessary to generate CRC bytes for the super packet and append those bytes to the super packet to form a "super CRC packet".

As the super CRC packet is passed through various interfaces, it should be checked to be sure that data is not corrupted.

Generating the CRC bytes necessary for error checking and checking the various packets and super packets is computation intensive and consumes valuable processing resources as well as introducing delays into the propagation of data.

Accordingly, efficient techniques to assure integrity of data stored on non-volatile media are needed in the industry.

SUMMARY OF THE INVENTION

According to an aspect of the present invention, error checking utilizing cyclic redundancy checking (CRC) techniques is utilized to check for errors as data passes across multiple interfaces.

According to another aspect of the invention, bang CRCs (!CRC) are predicted for cumulated data structures by utilizing the properties of appended bang CRCs using an equivalent structure of all "1"s. CRCs of cumulative $CRC^C$ structures are checked by comparing such predicted result and the result of explicit byte-by-byte calculation in the checker.

According to another aspect of the invention, the cumulative $CRC^C$ is calculated by the interface unit coupling a virtual drive emulation system to a disk storage unit.

Other features and advantages of the invention will be apparent in view of the following detailed description and appended drawings.

BRIEF DESCRIPTION OF THE DRAWINGS

FIG. 4 is a schematic diagram of a CRC checker; and

FIG. 5 is a pseudo-code chart depicting a CRC prediction method.

DETAILED DESCRIPTION OF THE PREFERRED EMBODIMENTS

Figure 1:
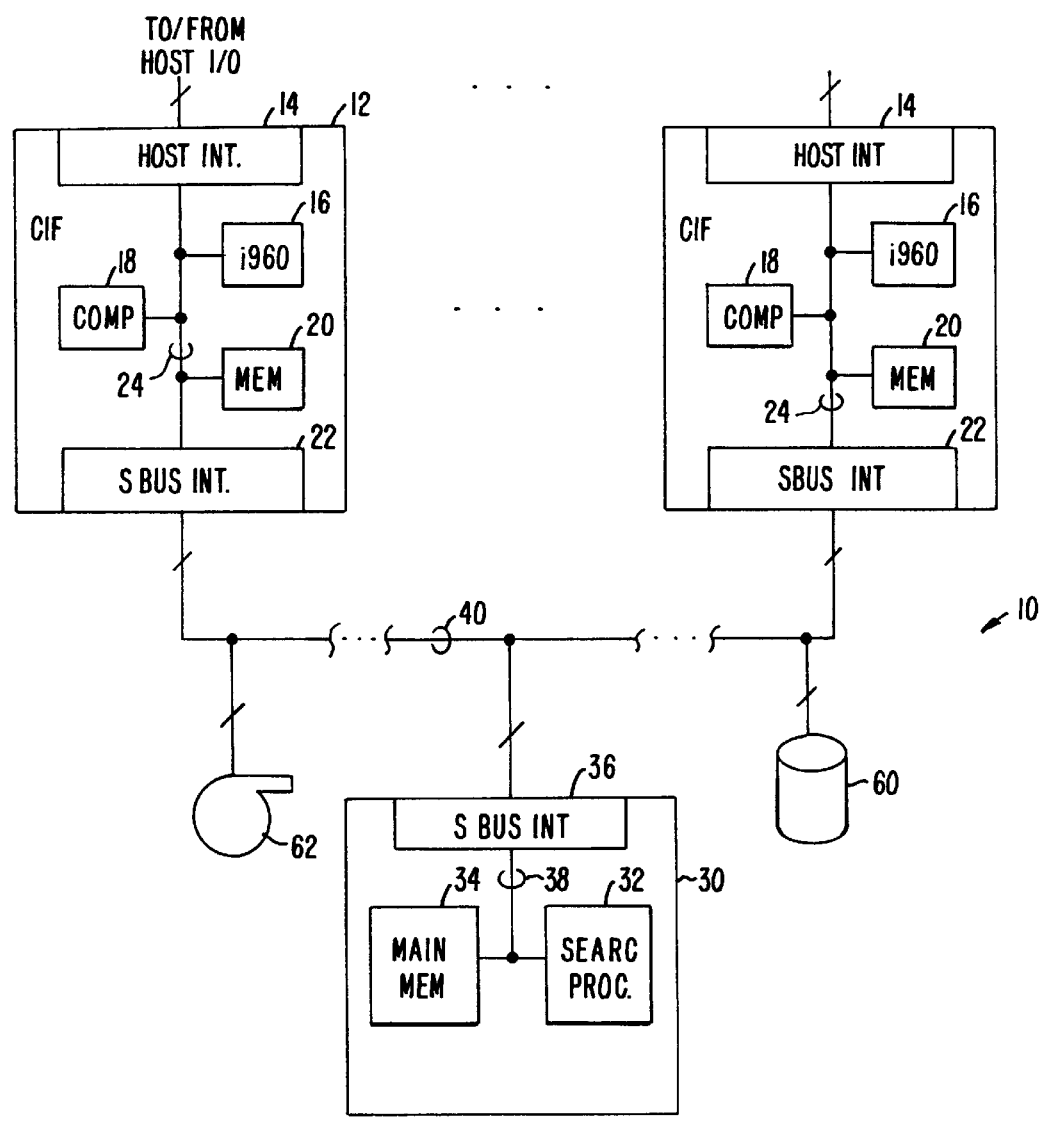
FIG. 1 is a block diagram of a preferred embodiment of the invention.

A preferred embodiment will now be described with reference to the figures, where like or similar elements are designated with the same reference numerals throughout the several views. FIG. 1 is a high level block diagram of a part of a tape drive emulation (TDE) system 10 utilizing an embodiment of the present invention.

A plurality of channel interfaces (CIFs) 12 are coupled to host I/O channels (not shown) to transfer data between the host and the TDE system 10.

Each CIF 12 includes a host interface 14, an embedded controller 16, a data formatter 18 for performing data compression and other functions, an SBUS interface 20, a buffer memory 22, and an internal bus 24. In the preferred embodiment, the embedded processor 16 is a model i960 manufactured by Intel Corporation.

The main controller 30 includes a main processor 32, main memory 34, an SBUS interface 36, and an internal bus 38. In the preferred embodiment, the main processor is a SPARC computer manufactured by Sun Microsystems Incorporated. The CIFs 12 and main controller 30 are coupled by a system bus 40.

The tape drive emulation (TDE) system 10 stores host data in "virtual volumes" mounted on "virtual tape drives." In one preferred embodiment, the data is originally stored on staging disks 60. Because TDE system 10 must interact with the host as if the data were actually stored on tape drives, a data structure called virtual tape drive (VTD) is maintained in main memory 34 for each virtual tape drive. The VTD contains information about the state of the associated virtual tape drive. Additional structures, including a virtual tape "volume" structure and other structures subordinate to it, register the locations at which data is physically stored, among other information. The CIFs 12 are implemented on dual system boards (DSBs) in a preferred embodiment.

Subsequently, data may be transferred from the staging disks 60 to one or more magnetic tape units 62. However, the location and other properties of the data is still defined in terms of the virtual tape volume structures in memory and stored in a disk-based control data set.

Figure 2:
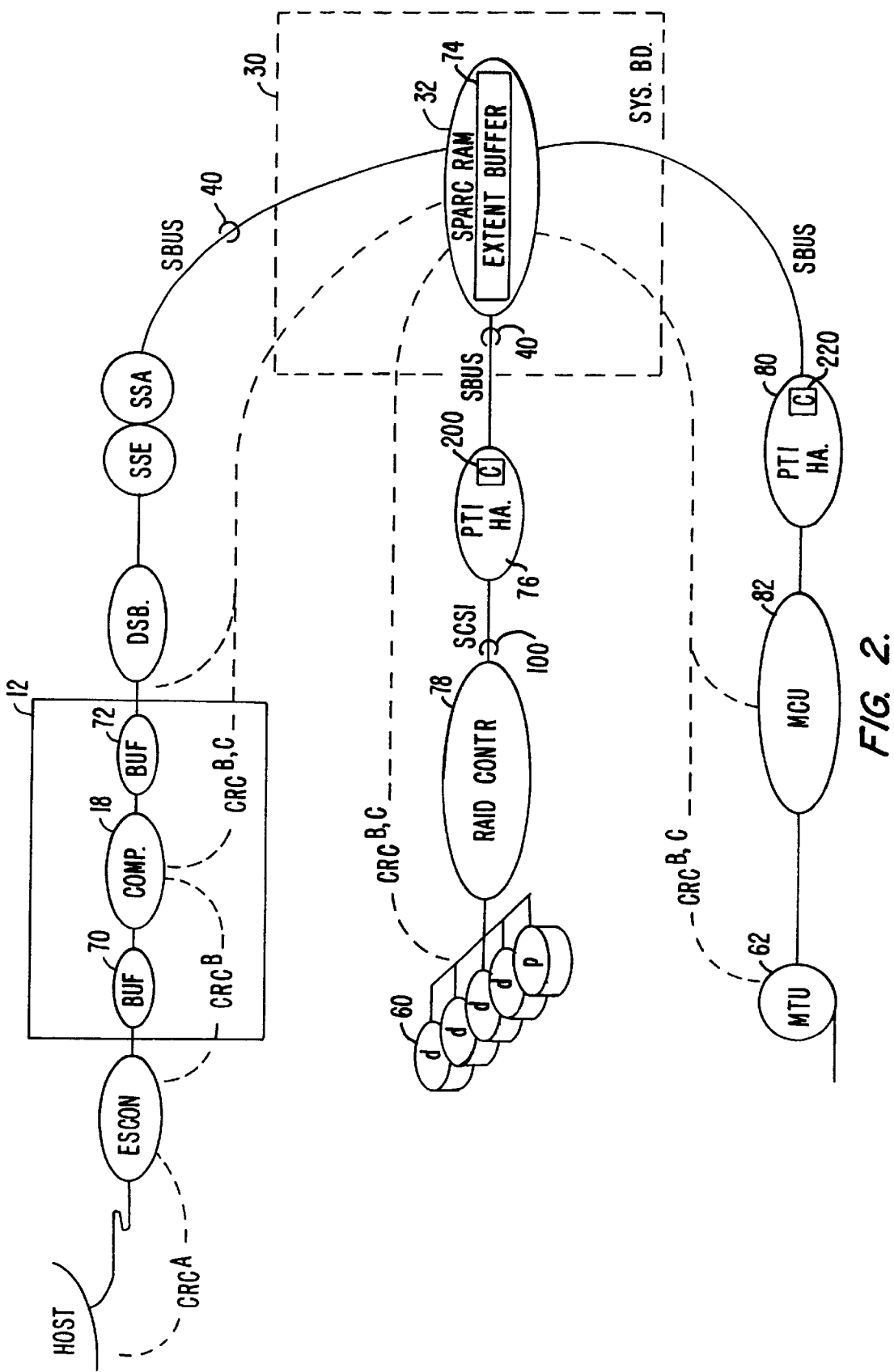
FIG. 2 is a schematic diagram depicting the data paths of the system depicted in FIG. 1.

The data paths of the embodiment depicted in FIG. 1 are shown in FIG. 2. In the preferred embodiment, data is first stored on staging disks 60. The staging disk space is treated as collections, called regions, of fixed-size space units called extents.

Referring to FIG. 2, a host computer coupled to a TDE system is depicted. A data I/O channel (not shown) of the host is coupled to an ESCON port, one of several which function as a network to connect several host channels and possibly several hosts to the TDE system.

The ESCON port is a component of a channel interface (CIF) 12 including buffers 70 and 72 and the data compression unit 18. The CIF 12 is coupled to an extent buffer 74 and the main controller 30 by the SBUS 40. The main controller 30 is coupled to the staging disks 60 (which in this embodiment is a RAID) by a first host adapter (HA) 76 and RAID controller 78 and to a magnetic tape unit (MTU) 62 by a second HA 80 and a magnetic tape controller unit 82 (MCU).

Packets are formed in the CIFs 12 and stored in extent buffer 74. In a preferred embodiment, the packets are packetized on the model of data packets of the 3480/IDRC or 3490 (see ANSI X3.224-1994, X3.225-1994).

Each data block written to the TDE system is compressed (if possible and unless a channel command prevents it) in hardware of the channel interface and "packetized" on the model of data packets of the 3480/IDRC or 3490 (see ANSI X3.224-1994, X3.225-1994). A block is compressed independently of all other blocks; that is, the compression algorithm is reset at the beginning of each block and any single block can be decompressed by itself.

The packet includes the byte sequence output by the compressor (or the uncompressed block byte sequence if no-compression is invoked); a fixed-length preamble, variously called the Packet-ID or the Packet Header; and, a postamble of variable length called the Packet Trailer. The combined length of the data and the Packet Trailer is constrained in the preferred embodiment to be a multiple of 32 bytes. Padding (inserted 0's) is included in the trailer to satisfy this constraint.

Figure 3:
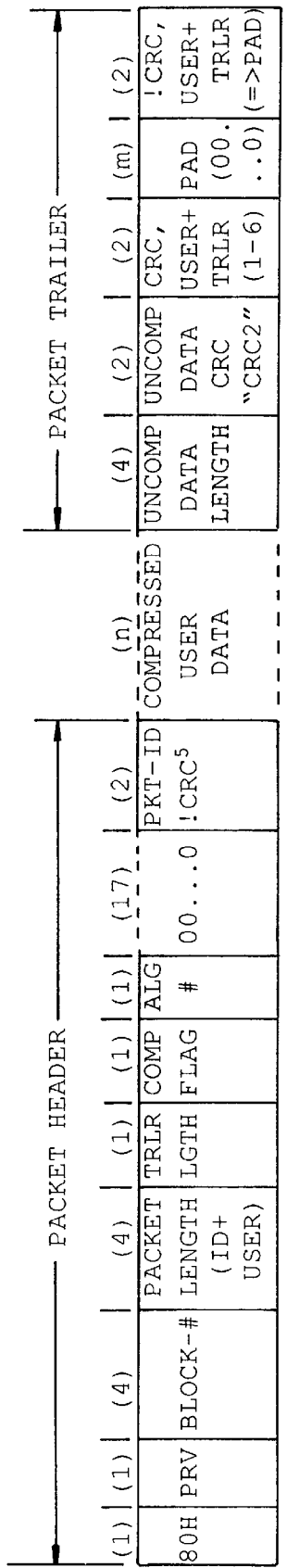
FIG. 3 is a schematic diagram of an IDRC packet.

FIG. 3 shows details of the packet formats for compressed and uncompressed blocks, respectively. Each packet formed in a CIF is assigned a block ID which is included in the packet. Packet header bytes from offset 113 through offset 29 are required by the format standard to be filled with the value 00H. The channel interface may store a "signature" of several bytes in this field for use in integrity checks and diagnostics. The bytes will be cleared, however, before the packet is written to tape. See FIG. 3 for definitions of the bytes. This format is well-known in the art and is not part of the present invention.

The CIF buffers 70 and 72 are regions of the channel interface memory 20. The extent buffer 74 is a region of main memory 34. The size of the extent buffer is the same as the fixed-space unit on the disk to facilitate efficient transfer between the staging disks 60 and extent buffer 74.

In one write mode of operation, entire packets are transferred from the CIFs 12 to the extent buffer 72. When there is not room in the extent buffer for another entire packet the remaining unused part of the extent buffer is packed with ones and then the contents of the buffer are written to a fixed-sized region on the staging disk.

Prior to describing the operation of the present preferred embodiment, a brief overview of CRC calculation and checking is presented. These techniques are well known in the art, and are described in more detail in appendix A.

Briefly, a sequence of data bytes [D1, D2, D3, . . . Dn] is represented as polynomials with powers of x indicating the position of a data bit in the sequence and the coefficients of the power of x being the value of the bit.

Thus, for example, each byte Di is represented by the polynomial:

$$Di = d_{i1}x^7 + d_{i2}x^6 + \ldots d_{i7}x + d_{i8}.$$

The value of the most significant bit in the byte is $d_{i1}$ and the value of the least significant bit is $d_{i8}$.

The entire byte sequence then is represented by a large polynomial, D(x):

$$D(x) = D_1 x^{8(n-1)} + D_2 x^{8(n-2)} + \ldots + D_n$$

When polynomial are added or subtracted, co-efficient arithmetic is modulo-2 arithmetic for coefficients of like powers of x.

After CRC bytes are calculated and appended to the data sequence, an extended sequence is formed:

$$E = [D1, D2, \ldots Dn, C1, C2]$$

and in polynomial form:

$$E(x) = D(x)x^{16} + C1x^8 + C2.$$

The CRC bytes are chosen to have the property that:

$$E(x) = 0, \text{modulo-}G(x), \text{ where}$$

$$G(x) = x^{16} + x^{15} + x + 1 = 0.$$

A simple CRC generator is depicted in FIG. 4.

Additionally, a "bang CRC", denoted !CRC, is calculated by first inverting the bits in the data sequence, calculating the CRC bytes, as described above, on the inverted data sequence, and then inverting the calculated CRC bytes themselves.

If the bang CRC bytes, calculated from the inverted data sequence, are appended to the original, non-inverted, data sequence, then an extended bang sequence is formed:

$$EB = [D1, D2, \ldots Dn, !C1, !C2].$$

This extended bang sequence has the useful property that when polynomialized and divided by G(x), the remainder is the same as dividing a sequence of all ones, having the same length as EB, by G(x).

As depicted in FIG. 3, the packet header is in the form of an extended bang sequence, as is the concatenation of the compressed user data and packet trailer. Another useful property of the extended bang sequences is that if two EBs are concatenated, the remainder of division by G(x) is the same as the remainder of a sequence of all ones bytes, equal in length to the concatenated bang sequence, divided by G(x).

Returning now to the description of the operation of the present preferred embodiment, in one write mode of operation, a short descriptive extent header, including a bang CRC covering the information bytes of the header, is placed at the beginning of an extent buffer. Thereafter, entire packets are transferred from the CIFs 12 to the extent buffer 72. When there is not room in the extent buffer for another entire packet, the remaining unused part of the extent buffer is packed with ones and then the contents of the buffer, termed an extent, are written to a fixed-sized region on the staging disk. Alternatively, only part of the remaining part of the buffer may be padded with ones, in the smallest amount needed to make the aggregate length of header, packets, and pad bytes commensurate with the sector size of the disk, and that aggregate length is written to the disk.

Thus, the extent is a concatenation of the header, the IDRC packets, and a sequence of all ones bytes. Another useful property of the extended bang sequences is that if a padding sequence of all ones bytes is concatenated with a concatenated sequence of extended bang sequences, the remainder of division by G(x) is the same as the remainder of a sequence of all ones bytes having the same length as the concatenated sequence of extended bang sequences concatenated with the padding sequence of all ones bytes.

As described above with reference to FIG. 2, data is transferred from the extent buffers 74 to staging disks 60 through the first host adapter 76 and RAID controller 78 and subsequently, in some cases, from staging disks through extent buffers and to the tape drives 62 through the second host adapter 80 and the MCU 82.

The present invention provides a high degree of data integrity monitoring by performing CRC checking as it passes through each host adaptor 76 and 80 and the tape controller 82. Additionally, the need to compute CRC bytes explicitly by operating on the whole collection of bytes stored in the buffer for each extent formed in the extent buffer is eliminated by the unique system of error checking described below.

In the presently described embodiment, the first host adapter 76 interfaces between the SBUS 40 and a SCSI bus 100. When an extent (or number of extents) is transferred from the extent buffer 74 to the RAID controller, it is error checked in first host adapter 76. A checking value is obtained by dividing the sequence of data bytes in the extent by G(x), using a calculating circuit provided on the host adapter for the purpose. The checking value is compared to a value predicted by software in the SPARC processor, based only on the length of the transfer.

In the presently described embodiment, a first CRC checker 200 is built into the SCSI port of the first HA 76 to which staging disk controller 78 is attached, and a second CRC checker 220 is built into the SCSI port of the second HA 80, to which the MCU 80 is attached.

The CRC checker is conceived as either a SCSI target installed on the SBUS card and attaching to the SCSI-bus side of the first HA 76 or as a passive "snooper" circuit attaching to the SCSI-bus side and controlled by the HA. The CRC checker monitors data outbound to any, or any other, target on the SCSI bus. If desired, it also monitors data inbound.

The CRC checker computes a CRC value for the data transfers of all writes to a given target or Logical Unit (LUN) when a target supports multiple LUNs. For multiple targets or LTJNS, separate CRC values for each target or LUN may be computed. In an alternative supported mode of operation, separate CRCs are calculated for each write command issued when the optional SCSI feature of tagged command queuing is in use. The only command that must be supported by the checker is the reading of the present state (value) of the CRC checker for a particular target. A useful alternative mode of operation is provided if the calculator control firmware can be enabled to initialize the value uniformly to a desired starting value at the start of each write. In another extension, the circuit is used to calculate CRCs on data being read from the disk. In all cases, either the HA control program (if a passive snooper is used) or the checker firmware (if the checker is a separate SCSI target) captures the states of the calculator between operations to make them available to the SPARC software.

When the checker is to be used in the mode afforded when the calculator is read-only, the SPARC-resident software reads the state of the calculator before the beginning of one or a sequence of several writes and reads it again on the completion of the sequence. The final calculator state is predicted by the software from the initial state and knowledge of the aggregate length of written extent data. In the mode in which the calculator is initialized for each operation to a uniform starting state, only the end state must be read.

Pseudo-code for a technique of generating a new predicted value from an old one and a knowledge of the total length of transfers intervening between value readings is set forth in FIG. 5. These prediction steps are performed by software executed in the main processor 32. Referring to FIG. 5, the prediction is generated utilizing three tables. If the old prediction is 0000H, then steps 1 and 2 may be skipped, leaving 0000H as the partial prediction. In step 1, the first table is a logarithm table organized as 65,535 16-bit words, each containing an element in the finite (Galois) field of $2^{16}$ elements. Otherwise, index into the table and save the logarithm value fetched for step 2.

In step 2, the second table is organized as an antilog table having a length of 65,535 16-bit words. To index the second table, add the log value obtained in step 1 to the aggregate length (counted in 16-bit words) of all extents written since the last prediction update. Reduce the sum modulo-65,535, that is, divide the sum by 65,535, throw away the quotient and keep the remainder, and index the second table by the result to find a new partial prediction.

In step 3, the third table is indexed by the aggregate length of all extents which have been written through the SCSI port to this LUN since the last update. The length is measured in words of sixteen bits and is reduced modulo-65,535 before its use as an index. Add, bitwise modulo-2, the value from the third table to the partial prediction. This yields the new prediction which is saved and compared to the state of the checker.

Techniques for generating the first, second, and third tables are set forth in appendix A.

The invention has now been described with reference to the preferred embodiments. Alternatives and substitutions will now be apparent to persons of skill in the art. In particular, the packet format depicted in FIG. 3 may be modified as long as each part of the packet or the whole packet is in the form of an extended bang sequence. Similarly, byte groups other than packets may be inserted in the sequence as long as each of such byte groups is in the form of an extended bang sequence. The particular form of the CRC checker and algorithm for predicting CRC may be modified in ways well known to those skilled in the art. Accordingly, it is not intended to limit the invention, except as provided by the appended claims.

APPENDIX

8.1 A CRC GENERATOR (1) $G(x)=x^{16}+x^{15}+x^8+x+1$ The "Generator Polynomial"

(2) Call the sequence of data bytes received at the CRC calculator (block size=n)

$$D=[D_1, D_2, \ldots D_n]$$

(ANSI byte numbering convention)

(3) After CRC bytes are calculated and appended to the data string, the result is:

$$E=[D_1, D_2, \ldots D_n, C_1, C_2]$$

(The choice of 'E' here is suggestive, because E is 'extended' from by adding the two bytes $C_1, C_2$.)

If the bytes in the sequence are viewed as groups of coefficients in a polynomial, that is, each $D_1=d_{i1} x^7+d_{i2}x^6+\ldots +d_{i7}x+d_{i8}$ ($d_{ij}$ are the bits in the byte), then the whole string may be viewed as a polynomial:

$$E(x) = D_1 x^{8(n-1)+16} + D_2 x^{8(n-2)+16} + \ldots + D_n x^{16} + C_1 x^8 + C_2$$

$$= D(x) \cdot x^{16} + C_1 x^8 + C_2$$

(4) If $C_1$ and $C_2$ have been chosen properly, the polynomial $C(x)$ has the property that $$E(x)=0, \text{modulo-}G(x)^9, \text{ or}$$

$$D(x) \cdot x^{16} = C_1 x^8 + C_2, \text{modulo-}G(x)$$

That is, if C(x) is divided by G(x) (using modulo-2 arithmetic on the coefficients), the division is exact, and the remainder is 0.

(5) To find the right values for $C_1$ and $C_2$, we may calculate them successively as data bytes arrive, looking up values in a table which contains all 256 values of $D \cdot x^{16}$, modulo-$G(x)$:

$$D_1 x^{16} = C_{1,1} x^8 + C_{2,1}, \text{table at } D_1$$

$$D_1 x^{24} + D_2 x^{16} = C_{1,2} x^8 + C_{2,2}, \text{table at } C_{1,1} \oplus D_2,$$

$$C_{2,1} \text{ added to } MSB \text{ to get } C_{1,2}$$

$$D_1 x^{32} + D_2 x^{24} + D_3 x^{16} = C_{1,3} x^8 + C_{2,3}, \text{table at } C_{1,2} \oplus D_3,$$

$$C_{2,2} \text{ added to } MSB \text{ to get } C_{1,3}$$

$$\ldots \quad \ldots$$

$$\ldots + D_n x^{16} = C_{1,n} x^8 + C_{2,n}, \text{"""} C_{1,n-1} \oplus D_n, C_{2,n-1} \text{"""""} C_{1,n}$$

At each step, we multiply the previous CRC by $x^8$, equivalent to multiplying the polynomial of data bytes so far by $x^8$, combine with the new data byte ($D_{new}x^{16}$), and reduce the result modulo-$G(x)$.

(6) FIG. 1 shows a concept diagram of a CRC calculator.

---

[9] The meaning of "modulo-$G(x)$" is that in the algebra of these calculations. $G(x) = 0$, that is, $x^{16} + x^{15} + x^8 + x + 1 = 0$, or
$x^{16} = x^{15} + x^8 + x + 1$ (remember that coefficient arithmetic is modulo-2) so that any polynomial of degree sixteen or greater can be reduced to one of degree less than sixteen "modulo-$G(x)$."

---

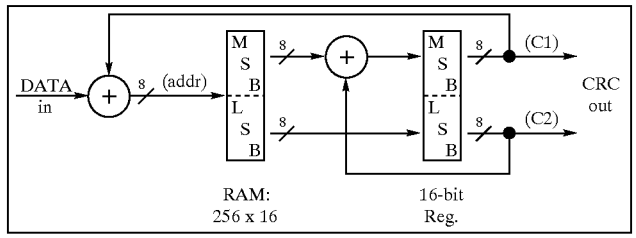

Figure 20 CRC Generator

8.2 THE CRC'S IN EDRC (1) ANSI X3.225 specifies that some CRC's are to be formed by inverting the data before the CRC calculation and then inverting the resulting CRC before appending it to the data. With the aid of some special tables, software can convert an ordinary CRC to the value it would have under this 'inverting' prescription.

Let the all-ones byte (hex FF) be $$U = x^7 + x^6 + x^5 + x^4 + x^3 + x^2 + x + 1$$

The encoding of i all-ones bytes with CRC appended is:

$$U_i(x) = Ux^{8(i-1)+16} + Ux^{8(i-2)+16} + \ldots + Ux^{16} + C_{1u}x^8 + C_{2u}$$

The ordinary encoding of an n-byte data string to n+2 bytes including the CRC is:

$$E(x) = D_1 x^{8(n-1)+16} + D_2 x^{8(n-2)+16} + \ldots + D_n x^{16} + C_1 x^8 + C_2$$

And the 'inverted' encoding of the n-byte string is ("^" means inversion or complementing)

$$\hat{E}'(x) = \hat{D}_1 x^{8(n-1)+16} + \hat{D}_2 x^{8(n-2)+16} + \ldots + \hat{D}_n x^{16} + C_1' x^8 + C_2'$$

Remembering that arithmetic on coefficients here is modulo-2, that is, that "+" means XOR, you can see that $$\hat{D}_i = D_i + U$$

I say, without proving it, that these polynomials preserve their interesting properties when they are combined in such linear operations as addition of the polynomials. For instance, $$E_A(x) + E_B(x) = (D_{1A} + D_{1B})x^{8(n-1)+16} + (D_{2A} + D_{2B})x^{8(n-2)+16} + \ldots + (D_{nA} + D_{nB})x^{16} + (C_{1A} + C_{1B})x^8 + (C_{2A} + C_{2B})$$

In particular, $$\hat{E}'(x) = E(x) + U_n(x)$$

from which, $C_1' = C_1 + C_{1u}$, $C_2' = C_2 + C_{2u}$, ($C_{1u}, C_{2u}$ looked up in a table) and the CRC required by the 'inverting' prescription is found by inverting $C_1'$ and $C_2'$ Further, the inverting of the calculated CRC is equivalent to adding $Ux^8 + U$ (16 ones) to $C_1' x^8 + C_2'$ Remember (1) that we only invert the data to calculate the CRC, i.e., we store the data $D(x)$ without inversion, (2) that we also store the CRC compounded from $$(C_1 x^8 + C_2) + (C_{1u} x^8 + C_{2u}) + (Ux^8 + U)$$

and (3) in a subsequent division of the complete stored polynomial (by a CRC checker, for example), the contribution to the result by $E(x) = D(x) + C_1 x^8 + C_2$ is always 0 since $$D(x) = (C_1 x^8 + C_2), \text{modulo } G(x).$$

Therefore, to understand the checker's calculation, we only need to think about the division of $$\underline{(C_{1u} x^8 + C_{2u}) + (Ux^8 + U)} \text{ by } G(x).$$

Since $$U_i(x) = Ux^{8(i-1)+16} + Ux^{8(i-2)+16} + \ldots + Ux^{16} + C_{1u}x^8 + C_{2u},$$

modulo $G(x)$ $$Ux^{8(i-1)+16} + Ux^{8(i-2)+16} + \ldots + Ux^{16} + 0x^8 + 0 = C_{1u}x^8 + C_{2u}, \text{ and}$$

$$Ux^{8(i-1)+16} + Ux^{8(i-2)+16} + \ldots + Ux^{16} + Ux^8 + U =$$

$$\underline{(C_{1u}x^8 + C_{2u}) + (Ux^8 + U)}.$$

In other words, the checker will produce the same result in it's division whether it divides the stored polynomial or a sequence of ones having the same total length as the stored polynomial!

2) Figure shows the contents of the header of an EDRC Packet. Figure and Figure show the user data and the packet trailer fields for packet data which does and does not compress. In the OSS emulation of EDRC, the Packet header CRC, CRC1, can be computed by software executing the algorithm of Figure, after the other fields have been filled in. The data bytes must be inverted before the calculation and the CRC inverted afterward.

Alternatively, the Figure algorithm can be used to compute a CRC on the (inverted) first 13 bytes and the insertion of the 17 pad bytes (bytes 14–30) can be computed.

This can be done with the aid of two more 256×16-bit lookup tables, each indexed by one of the CRC bytes calculated on the first 13 bytes. One table contains the results of multiplying all possible byte values by $x^{8+8(17)}$ and the other the results for multiplication by $x^{8(17)}$. Part of the wanted CRC is found by XOR'ing the result of the two lookups. The basis for this calculation is that $$D(x) \cdot x^{16} = C_{1a}x^8 + C_{2a}, \text{ modulo-}G(x),$$

where $D(x)$ is the 'polynomialized' string of the first 13 bytes

Shifting left to make room for the pad bytes is done as $$D(x) \cdot x^{16} \cdot x^{8(17)} = (C_{1a}x^8 + C_{2a})x^{8(17)} = C_{1a}x^{8+8(17)} + C_{2a}x^{8(17)}$$

The lookups give the modulo-$G(x)$ values of the two terms on the right. These (16-bit) values must be XOR'ed with each other and with a fixed value for a string of 17 all-ones-bytes (the inverted padding). Finally, the result must be inverted.

We can "extend" CRC-c to make room for the first six trailer bytes by multiplying $$(C_{c1}x^8 + C_{c2})x^{8(6)} = C_{c1}x^{8(7)} + C_{c2}x^{8(6)}, \text{ modulo-}G(x)$$

and insert the trailer bytes, $T_1$–$T_6$ as $$T_1 x^{16+8(5)} + \ldots T_6 x^{16}, \text{ modulo-}G(x).$$

We can compute by first XOR'ing $T_1$ with $C_{c1}$ and $T_2$ with $C_{c2}$, since these are coefficients of $x^{8(7)}$ and $x^{8(6)}$, respectively, and then applying the FIG. 1 algorithm on the six bytes:

$$(T_1+C_{c1}), (T_2+C_{c2}), T_3, T_4, T_5, T_6,$$

to find the bytes of CRC3.

(5) CRC4 can be computed from CRC3. When CRC3 is appended to (compressed user data+trailer bytes 1–6, making a trailer of eight bytes length, a CRC calculated on the entire new sequence has the value 0, identically. Therefore, continuing to calculate as pad bytes are appended gives successively more values of 0 ($0x^8+0$). Applying the 'inversion' scheme of 8.2 (2) yields a CRC, (before the final inversion) which is just the CRC on (n+4+2+2+m) all-ones bytes and therefore only depends on the data length.

| Figure 21. Packet-ID (Packet Header) Contents | | | | | | | | |
|---|---|---|---|---|---|---|---|---|
| Bytes: | 1 | 2 | 3–6 | 7–10 | 11 | 12 | 13 | 14–30 | 31.32 |
| | 80H | prv | block-# | packet length (id+user) | trlr lgth | comp flag | alg # | 00...0 | pkt-id CRC "CRC1" |

(3) Hardware must be included to compute a CRC (CRC-u=$C_{u1}x^8+C_{u2}$) on the uncompressed data and a CRC (CRC-c=$C_{c1}x^8+C_{c2}$) on the compressed data If the data is found to be compressible, that is, if it does not expand in the compression attempt, then the value in CRC2 is CRC-u.

| FIG. 22. Compressed User Data and Packet Trailer | | | | | | |
|---|---|---|---|---|---|---|
| $B_1 = B_n$ | <== $T_1$ = $T_6$ ==> | | | | | |
| (size | (n) | (4) | (2) | (2) | (m) | (2) |
| (A: processed data case) | compr. user data | uncomp data lgth | uncomp data CRC "CRC2" | CRC, user + trlr (1–6) "CRC3" | pad (00 . . . 0) | CRC, user + trlr (=>pad) "CRC4" |

(4) The value of CRC3 can be found with software. Since the CRC calculation on the compressed data gives $$B_1 x^{8(n-1)+16} + B_2 x^{8(n-2)+16} + \ldots + B_n x^{16} = C_{c1}x^8 + C_{c2}, \text{ modulo} - G(x)$$

| FIG. 23. Uncompressed User Data and Packet Trailer | | | |
|---|---|---|---|
| (size | (n') | (m') | (2) |
| (B: non-processed data case) | uncompr. user data | pad (00 . . . 0) | !CRC user + trlr (=>pad) "CRC4" |

(6) For data which does not compress, the Packet Trailer is as shown in Figure. For this case, CRC4 can be computed from CRC-u, the CRC calculated by hardware on the uncompressed data. The calculation done by the hardware can be continued in software to append the "m" pad bytes, or table lookup could be done to multiply the bytes of CRC-u by $x^{8(m)}$ and $x^{8(m-1)}$, respectively. Thirty-one pairs of 256×16-bit tables would be needed for all nonzero values of m. The effect of data inversion might be computed by the method of 8.2 (1).

8.3 CRC's on Packet Sequences

In the box in section 8.2, we established (or at least declared) that a CRC checker doing division on a stored span of data including one of the !CRC's gets the same result as if it did the division on a string of all ones of the same length as the span. Routing a packet (data+trailer of length n) to the checker immediately following a packet header is equivalent to concatenating the two in this way:

$$E_{packet\ hdr}(x) * x^{8(n+1)} + E_{packetdata\ \&\ trlr}(x),$$

and that is equivalent to routing to the checker a string of all-ones bytes of length n+32, the combined length of the packet.

Similarly, routing two packets (lengths n and m) in unbroken sequence to a checker concatenates them as $$E_{1st\ packet}(x) * x^{8(m+1)} + E_{2nd\ packet}(x),$$

and is equivalent to routing (n+m) all-ones bytes to the checker.

This equivalence to 'length-of-ones' extends to concatenations of any number of packets or other structures containing a !CRC. And of course, actual strings of ones can be inserted between packets and their lengths be added to the aggregate length in the equivalence assertion.

8.4 The SCSI-Port CRC Checker

We review here the idea and use of a CRC checker built into the SCSI ports to which staging disk controllers are attached. The CRC checker is conceived as a SCSI target installed on the S-Bus card and attaching to the SCSI-bus side of the interface. The checker monitors all data outbound to any other target on the bus.

1. The CRC checker computes a CRC value for the data transfers of all writes to a given target. If multiple targets are attached, the checker must have a separate CRC value for each, possibly accessible as a separate logical unit within the checker target, numbered to reflect the numbering of the monitored targets.

2. CRC's calculated for targets which are not RAID controllers can be ignored for our purposes.

3. The only command that must be supported by the checker is the reading of the present state (value) of the CRC checker for a particular target.

4. As I/O is directed to a RAID target, someone (possibly the device driver) will maintain an ongoing prediction of the state of the CRC checker.

5. Each time synchronization is required, that is, each time in the writing of a virtual volume that a Write Tape Mark, Synchronize, or Read Backward command or a tape motion command is issued, the driver will read the CRC checker's state after the last data of the virtual volume (to that point) has been written and will compare the value read against the value predicted. A match is required for the synchronization to succeed.

6. Testing of the checker state could and probably should be done more frequently, but the test must be done at synchronization points to confirm that data up to those points has been sent correctly to the disk.

7. A preferable schedule of checker testing would be at the completion of each sequence of write commands done on behalf of a particular virtual tape unit. The most practical choice might be to test after every write command.

8. The values found in the checker at these readings will not ordinarily be zeros.

9. The CRC's included by the channel interface at the end of each packet header and each packet trailer should be the !CRC as prescribed by the IDRC standard, and not the "normal" CRC proposed earlier by me for data on its way to the staging disk.

The checker is presumed to check separately write transfers to different disk drives (arrays) attached to it. A separate prediction is needed for each such logical device. Predictions of the sixteen-bit CRC checker state requires some calculations by the staging disk scheduler or driver (or ??) program executing in the SPARC machine. In particular, each time an updated prediction is needed, the old prediction must be changed by adding ($\oplus$) to it values found with the aid of three tables:

1. The first table is indexed by the old prediction. This table is a logarithm table organized as 65.535 16-bit words, each containing the logarithm of an element in the finite (galois) field of length $2^{16}$. If the old prediction is 0000H, skip step 2. Otherwise index into the table and save the value fetched for the next step.

2. The second table is an antilog table of length 65,535, 16-bit words. To index it, add the log from step 1 to the aggregate length (counted in 16-bit words) of all extents written since the last prediction update. Reduce the sum modulo-65,535[10] and index the table by the result. Add ($\oplus$) the value from the table to the prediction.

[10]This means divide the sum by 65.535, throw away the quotient and keep the remainder.

3. The third table is indexed by the aggregate length of all extents which have been written through the SCSI port to this target drive (array). The length is measured in words of sixteen bits and is reduced modulo-65,535 before its use as an index. Add ($\oplus$) the value from the table to the prediction. This yields the new prediction. Save it and compare it to the state of the checker.

The tables required total≈192 kbytes.

```
static unsigned short ones_crc[ ];     // see 8.5 for creation of this array
static unsigned short crc_log[ ];      // see 8.5 for creation of this array
static unsigned short crc_log[ ];      // see 8.5 for creation of this array
unsigned short predict(prediction, length)
unsigned short prediction;
unsigned length;                       // aggregate length since last prediction
{
    length=length%65535;               // reduce length mod 2^16 -1
    if(prediction)                     // do steps 1, 2
        prediction=prediction^crc_antilog[(crc_log[prediction ]+
        length)%65535];
    prediction=prediction^ones_crc[length];
    return (prediction);
{
```

The benefits of this approach to checking:

Implicitly measures the length of transfer: the value of the checker at the end of each item cycles through the CRC circuit as the next item is transferred, producing a different effect for each of 64k different shift lengths (16-bit-word shifts). Further, the !CRC incorporates a length-dependent value representing the item length of all-ones values.

Does a CRC check over all data.

Is not defeated by a "stuck" bus: a bus that transmits only all-ones or all-zeroes (or all of any other bit pattern, for that matter will not fool this checker.

8.5 ARITHMETIC WITH THIS GENERATOR POLYNOMIAL

We said that algebra modulo-G(x), (G(x) is the "Generator Polynomial") means that $$G(x)=0.$$

or $$x^{16}+x^{15}+x^{8}+x+1=0$$

This implies that $$x^{16}=x^{15}+x^8+x+1$$

The way we apply this idea to a polynomial of degree higher than 15 is to imagine that each non-zero term of high degree is found by successive multiplications by x. For example (terms with 0 coefficient are not shown, but their presence is implied e.g., $G(x)=1x^{16}+1x^{15}+0x^{14}+0x^{13}+0x^{12}+0x^{11}+0x^{10}+0x^9+1x^8+0x^7+0x^6+0x^5+0x^4+0x^3+0x^2+1x+1$), $$\begin{aligned}
x^{19} &= x \cdot x \cdot x \cdot x^{16} \\
&= x \cdot x \cdot x \cdot (x^{15} + x^8 + x + 1) \\
&= x \cdot x \cdot (x^{16} + x^9 + x^2 + x) \\
&= x \cdot x \cdot ((x^{15} + x^8 + x + 1) + (x^9 + x^2 + x)) \\
&= x \cdot x \cdot (x^{15} + x^9 + x^8 + x^2 + 1) \\
&= x \cdot (x^{16} + x^{10} + x^9 + x^3 + x) \\
&= x \cdot ((x^{15} + x^8 + x + 1) + (x^{10} + x^9 + x^3 + x)) \\
&= x \cdot (x^{15} + x^{10} + x^9 + x^8 + x^3 + 1) \\
&= x^{16} + x^{11} + x^{10} + x^9 + x^4 + x \\
&= (x^{15} + x^8 + x + 1) + (x^{11} + x^{10} + x^9 + x^4 + x) \\
\underline{x^{19}} &= \underline{x^{15} + x^{11} + x^{10} + x^9 + x^8 + x^4 + 1}
\end{aligned}$$

We can tabulate this process, listing only the coefficients:

| term | $x^{15}$ | $x^{14}$ | $x^{13}$ | $x^{12}$ | $x^{11}$ | $x^{10}$ | $x^9$ | $x^8$ | $x^7$ | $x^6$ | $x^5$ | $x^4$ | $x^3$ | $x^2$ | $x$ | 1 | (HEX) |
|---|---|---|---|---|---|---|---|---|---|---|---|---|---|---|---|---|---|
| $x^{16}$ | 1 | 0 | 0 | 0 | 0 | 0 | 0 | 1 | 0 | 0 | 0 | 0 | 0 | 0 | 1 | 1 | 8103 |
| $x^{17}$ | 1 | 0 | 0 | 0 | 0 | 0 | 1 | 1 | 0 | 0 | 0 | 0 | 0 | 1 | 0 | 1 | 8305 |
| $x^{18}$ | 1 | 0 | 0 | 0 | 0 | 1 | 1 | 1 | 0 | 0 | 0 | 0 | 1 | 0 | 0 | 1 | 8709 |
| $x^{19}$ | 1 | 0 | 0 | 0 | 1 | 1 | 1 | 1 | 0 | 0 | 0 | 1 | 0 | 0 | 0 | 1 | 8F11 |
| $x^{20}$ | 1 | 0 | 0 | 1 | 1 | 1 | 1 | 1 | 0 | 0 | 1 | 0 | 0 | 0 | 0 | 1 | 9F21 |
| $x^{21}$ | 1 | 0 | 1 | 1 | 1 | 1 | 1 | 1 | 0 | 1 | 0 | 0 | 0 | 0 | 0 | 1 | BF41 |
| $x^{22}$ | 1 | 1 | 1 | 1 | 1 | 1 | 1 | 1 | 1 | 0 | 0 | 0 | 0 | 0 | 0 | 1 | FF81 |
| $x^{23}$ | 0 | 1 | 1 | 1 | 1 | 1 | 1 | 0 | 0 | 0 | 0 | 0 | 0 | 0 | 0 | 1 | 7E01 |
| $x^{24}$ | 1 | 1 | 1 | 1 | 1 | 0 | 0 | 0 | 0 | 0 | 0 | 0 | 0 | 1 | 0 | FC02 |
| $x^{25}$ | 0 | 1 | 1 | 1 | 1 | 0 | 0 | 1 | 0 | 0 | 0 | 0 | 0 | 1 | 1 | 1 | 7907 |
| $x^{26}$ | 1 | 1 | 1 | 1 | 0 | 0 | 1 | 0 | 0 | 0 | 0 | 0 | 1 | 1 | 1 | 0 | F20E |
| $x^{27}$ | 0 | 1 | 1 | 0 | 0 | 1 | 0 | 1 | 0 | 0 | 0 | 1 | 1 | 1 | 1 | 1 | 651F |
| $x^{28}$ | 1 | 1 | 0 | 0 | 1 | 0 | 1 | 0 | 0 | 0 | 1 | 1 | 1 | 1 | 1 | 0 | CA3E |
| $x^{29}$ | 0 | 0 | 0 | 1 | 0 | 1 | 0 | 1 | 0 | 1 | 1 | 1 | 1 | 1 | 1 | 1 | 157F |
| $x^{30}$ | 0 | 0 | 1 | 0 | 1 | 0 | 1 | 0 | 1 | 1 | 1 | 1 | 1 | 1 | 1 | 0 | 2AFE |
| $x^{31}$ | 0 | 1 | 0 | 1 | 0 | 1 | 0 | 1 | 1 | 1 | 1 | 1 | 1 | 1 | 0 | 0 | 55FC |

To find some expression of more than one term, we can add (modulo-2) these rows of coefficients. For example, to find $x^{24}+x^{21}+x^{17}$.

| | | | | | | | | | | | | | | | | | |
|---|---|---|---|---|---|---|---|---|---|---|---|---|---|---|---|---|---|
| $x^{24}$ | 1 | 1 | 1 | 1 | 1 | 1 | 0 | 0 | 0 | 0 | 0 | 0 | 0 | 0 | 1 | 0 | FC02 |
| $x^{21}$ | 1 | 0 | 1 | 1 | 1 | 1 | 1 | 1 | 0 | 1 | 0 | 0 | 0 | 0 | 0 | 1 | BF41 |
| $x^{17}$ | 1 | 0 | 0 | 0 | 0 | 0 | 1 | 1 | 0 | 0 | 0 | 0 | 0 | 1 | 0 | 1 | 8305 |
| Sum: | 1 | 1 | 0 | 0 | 0 | 0 | 0 | 0 | 0 | 1 | 0 | 0 | 0 | 1 | 1 | 0 | C046 |

Reorder the table (invert the order of the rows) to find a sometimes-useful matrix M:

$[d] \cdot$  $[M]$ $$[d_{15} d_{14} \ldots d_0] \cdot \begin{bmatrix} 0 & 1 & 0 & 1 & 0 & 1 & 0 & 1 & 1 & 1 & 1 & 1 & 1 & 0 & 0 \\ 0 & 0 & 1 & 0 & 1 & 0 & 1 & 0 & 1 & 1 & 1 & 1 & 1 & 1 & 0 \\ 0 & 0 & 0 & 1 & 0 & 1 & 0 & 1 & 0 & 1 & 1 & 1 & 1 & 1 & 1 \\ 1 & 1 & 0 & 0 & 1 & 0 & 1 & 0 & 0 & 0 & 1 & 1 & 1 & 1 & 0 \\ 0 & 1 & 1 & 0 & 0 & 1 & 0 & 1 & 0 & 0 & 0 & 1 & 1 & 1 & 1 \\ 1 & 1 & 1 & 1 & 0 & 0 & 1 & 0 & 0 & 0 & 0 & 0 & 1 & 1 & 0 \\ 0 & 1 & 1 & 1 & 1 & 0 & 0 & 1 & 0 & 0 & 0 & 0 & 0 & 1 & 1 \\ 1 & 1 & 1 & 1 & 1 & 0 & 0 & 0 & 0 & 0 & 0 & 0 & 0 & 1 & 0 \\ 0 & 1 & 1 & 1 & 1 & 1 & 0 & 0 & 0 & 0 & 0 & 0 & 0 & 0 & 1 \\ 1 & 1 & 1 & 1 & 1 & 1 & 1 & 1 & 0 & 0 & 0 & 0 & 0 & 0 & 1 \\ 1 & 0 & 1 & 1 & 1 & 1 & 1 & 0 & 1 & 0 & 0 & 0 & 0 & 0 & 1 \\ 1 & 0 & 0 & 1 & 1 & 1 & 1 & 0 & 0 & 1 & 0 & 0 & 0 & 0 & 1 \\ 1 & 0 & 0 & 0 & 1 & 1 & 1 & 0 & 0 & 0 & 1 & 0 & 0 & 0 & 1 \\ 1 & 0 & 0 & 0 & 0 & 1 & 1 & 0 & 0 & 0 & 0 & 1 & 0 & 0 & 1 \\ 1 & 0 & 0 & 0 & 0 & 0 & 1 & 1 & 0 & 0 & 0 & 0 & 0 & 1 & 0 & 1 \\ 1 & 0 & 0 & 0 & 0 & 0 & 0 & 1 & 0 & 0 & 0 & 0 & 0 & 0 & 1 & 1 \end{bmatrix}$$

| | |
|---|---|
| 55FC | $x^{31}$ |
| 2AFE | $x^{30}$ |
| 157F | $x^{29}$ |
| CA3E | $x^{28}$ |
| 651F | $x^{27}$ |
| F20E | $x^{26}$ |
| 7907 | $x^{25}$ |
| FC02 | $x^{24}$ |
| 7E01 | $x^{23}$ |
| FF81 | $x^{22}$ |
| BF41 | $x^{21}$ |
| 9F21 | $x^{20}$ |
| 8F11 | $x^{19}$ |
| 8709 | $x^{18}$ |
| 8305 | $x^{17}$ |
| 8103 | $x^{16}$ |

If $[d]=[d_{15}\ d_{14}\ \ldots\ d_0]$ is the coefficient vector of $d(x)= (d_{15}x^{15}+d_{14}x^{14}+\ldots+d_1x+d_0,)$, the matrix product below, $[d][M]$, gives the coefficient vector of $(d_{15}x^{15}+d_{14}x^{14}+\ldots+d_1x+d_0)x^{16}$ $[d] = [0\ 0\ 0\ 0\ 0\ 0\ 0\ 0\ 0\ 0\ 0\ 0\ 0\ 0\ 0\ 1],$ (8103)

$[d][M] = [1\ 0\ 0\ 0\ 0\ 0\ 0\ 1\ 0\ 0\ 0\ 0\ 0\ 0\ 1\ 1]$ $[d] = [1\ 1\ 1\ 1\ 1\ 1\ 1\ 1\ 1\ 1\ 1\ 1\ 1\ 1\ 1\ 1],$ (19A9)

$[d][M] = [0\ 0\ 0\ 1\ 1\ 0\ 0\ 1\ 1\ 0\ 1\ 0\ 1\ 0\ 0\ 1]$ $= (Ux^8 + U)x^{16}$

An equivalent to the matrix product is the shift_16 function below:

```
#define X16MODG    0x8103
#define BIT15      0x8000
#define WORDMASK   0xFFFF
unsigned short shift_16(d)
unsigned short d;
{
    int i;
    for (i=0; i<16; I++) {
        if(d & BIT15) {                    // if MSB is set,
            d = d << 1;    // shift and xor x^^16, mod g(x)
            d = d ^ X16MODG;
        }
        else       d = d << 1;             // otherwise, just shift
    }
    d = d & WORDMASK;
    return (d);
}          // return the d(x) * x^^16.
```

A way to build a table of CRC values for all lengths of strings of all-ones 16-bit words uses a function like shift_ 16(d) to compute [d][M] repeatedly for d's reduced mod g(x) and augmented by 0xFFFF in each iteration:

```
unsigned short ones_crc[65535];
t1build( )
{
    int i;
    unsigned short d = 0;      // The value at offset 0 is the CRC for
    for (i = 0; i < 65535; I++) { // length=1, i.e., for just 16 ones.
        d = d ⊕ 0xFFFF ;       // If we continued this past 65,535
        d = shift_16(d) ;      // iterations, the values would
        ones_crc[i] = d ;      // repeat cyclically.
    }
}
```

Using the same shift_16 function, we may construct the antilog table. This table is just the set of $d(x) * x^{16n}$, for n<65.535 and $[d]=[0000000000000001]$

```
unsigned short crc_antilog[65535];
genalogs( )
{
    unsigned d;
    int i;
    d = 1;                     // log(1) = 0. d is initialized to 1 * x^0·16
    for (i = 0; i < 65535; i++) {
        crc_antilog[1] = d ;
        d = shift_16(d) ;      // multiply by x^16 again, and reduce mod g(x)
    }
}
```

The log table is built from the antilog table. We don't have any log(0), since this is –∞. We will give it special handling. (See step 1 in the procedure of section 8.4

```
unsigned short crc_log[65535];
genlogs( )
```

-continued

```
{
    int i;
    for (i=0; i<65535; i++)
        crc_log[crc_antilog[i]] = i;
}
```

| (Size:) | (1) | (1) | (4) | (4) | (1) | (1) | (1) | (17) | Packet-ID (2) | User Data (n) | (4) | (2) | Packet Trailer (2) | (m) | (2) |
|---|---|---|---|---|---|---|---|---|---|---|---|---|---|---|---|
| | | | Packet Header | | | | | | | | | | Packet Trailer | | |
| | 80H | prv | block-# | packet length (id+user) | trlr lgth | comp flag | alg # | 00...0 | pkt-id !CRC[5] | compressed user data | uncomp. data length | uncomp. data CRC "CRC2" | CRC, user + trlr (1–6) | pad (00...0) | !CRC, user + trlr (=>pad) |
| | ← | — | — | — | — | — | — | — | → "CRC1" | ← | — | — | → "CRC3" | — | → "CRC4" |

[5]The notation !CRC represents a CRC value calculated on an inversion of the data bytes and then itself inverted. The Generator polynomial used in the calculation is the same one used for other CRCs in this document.

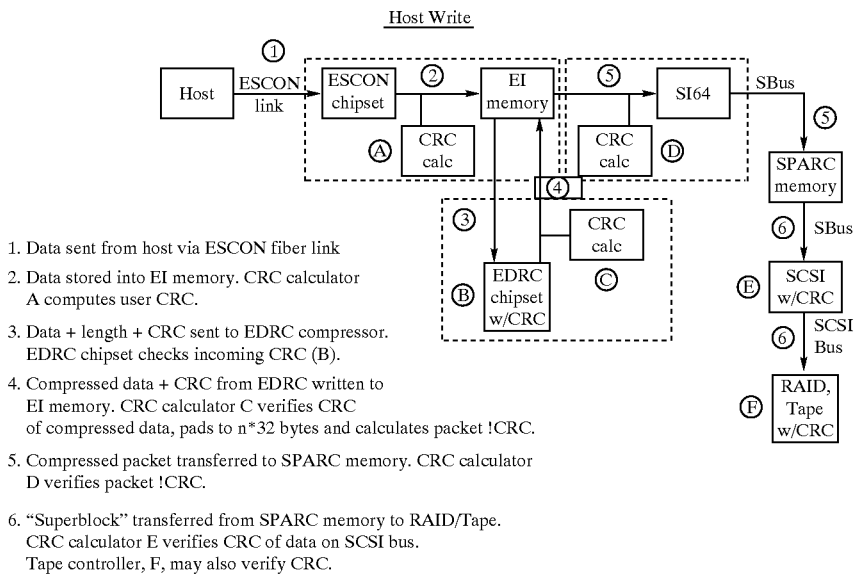

Host Write

1. Data sent from host via ESCON fiber link
2. Data stored into EI memory. CRC calculator A computes user CRC.
3. Data + length + CRC sent to EDRC compressor. EDRC chipset checks incoming CRC (B).
4. Compressed data + CRC from EDRC written to EI memory. CRC calculator C verifies CRC of compressed data, pads to n*32 bytes and calculates packet !CRC.
5. Compressed packet transferred to SPARC memory. CRC calculator D verifies packet !CRC.
6. "Superblock" transferred from SPARC memory to RAID/Tape. CRC calculator E verifies CRC of data on SCSI bus. Tape controller, F, may also verify CRC.

What is claimed is:

1. A method for maintaining data integrity in a storage system that stores and retrieves data generated by a host data processor, the storage system including a buffer and a controller, said method comprising the steps of:
   receiving blocks of data from said host computer;
   for each received block of data:
   forming a packet header including a first group of bytes having specified functions and a header !CRC based on said predetermined bytes, with said header !CRC being equal to a CRC calculated by inverting the bits in said first group, calculating a standard CRC on inverted bits, and inverting the standard CRC;
   forming a packet trailer including a second group of bytes comprised of said block and trailer bytes having specified functions, and a trailer !CRC based on a representation of said data block and said second group of bytes, with said trailer !CRC being equal to a CRC calculated by inverting all bits in said second group, calculating a standard CRC on inverted bits, and inverting the standard CRC;
   forming a packet by concatenating said packet header, said representation of said data block, and said packet trailer;
   subsequent to forming said packet storing a variable number of packets in a buffer of a predetermined size;
   concatenating said variable number of packets and adding padding bytes of all ones to form an extent having a length of a selected number of bytes;
   transferring said extent to non-volatile storage through a host adapter;
   in the host adapter, calculating an extent CRC for said extent during its transfer;
   calculating a test CRC for a sequence of said selected number of bytes of all ones;
   indicating a construction or transmission error if said extent CRC and said test CRC are not the same.

2. The method of claim 1 wherein the block included in said packet trailer is compressed.

3. The method of claim 1 further comprising the steps of:

storing a descriptive header in the buffer with the variable number of packets, the descriptive header including bytes of specified function and a !CRC based on the descriptive header; and concatenating the descriptive header with the variable number of packets before adding the padding bytes.

4. A system for error checking comprising:

a channel interface for receiving blocks of data and forming packets having a plurality of sequences with each sequence ending in a !CRC, the !CRC for a given sequence being equal to a CRC calculated by inverting the bits in said given sequence, calculating a standard CRC on the inverted bits, and inverting the standard CRC;

a first fixed-size buffer coupled to the channel interface for storing a plurality of complete packets transferred from said channel interface and padding bytes of all ones filling buffer space not occupied by the complete packets, with said plurality of complete packets and padding bytes forming an extent of said fixed-size;

a host adapter for transferring an extent to a storage device, said host adapter including:

a CRC checker for calculating CRC values on a transmitted sequence of packets written to said storage device;

a CRC predictor for predicting CRC predictions, based on tabulated results of dividing sequences of all ones bytes, including one equal in length, modulo a length characteristic of the CRC generator polynomial, to said transmitted sequence, by a generating polynomial;

means for comparing said CRC values and CRC predictions to detect construction or transmission errors.

5. The system of claim 4 further comprising a descriptive header for the plurality of complete packets in the first fixed-sized buffer, the descriptive header having bytes of specified function and a !CRC based on the bytes of the descriptive header.

* * * * *